(12) United States Patent
Grudowski et al.

(10) Patent No.: US 7,579,228 B2
(45) Date of Patent: Aug. 25, 2009

(54) DISPOSABLE ORGANIC SPACERS

(75) Inventors: Paul A. Grudowski, Austin, TX (US);
Kurt H. Junker, Austin, TX (US);
Thomas J. Kropewnicki, Austin, TX (US); Andrew G. Nagy, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 11/825,953

(22) Filed: Jul. 10, 2007

(65) Prior Publication Data

US 2009/0017587 A1   Jan. 15, 2009

(51) Int. Cl.
*H01L 21/8238* (2006.01)

(52) U.S. Cl. .................. 438/199; 438/514; 438/595; 438/710; 438/780; 438/943; 257/E27.064; 257/E27.108; 257/E21.632

(58) Field of Classification Search .............. 438/514, 438/531, 595, 780, 943, 710, 637, 638, 199; 257/E21.579, E27.064, E27.108, E21.632
See application file for complete search history.

(56) References Cited

U.S. PATENT DOCUMENTS

| 4,838,991 | A | | 6/1989 | Cote | |
| 5,651,857 | A | * | 7/1997 | Cronin et al. | ............... 438/696 |
| 6,228,747 | B1 | | 5/2001 | Joyner | |
| 6,555,442 | B1 | * | 4/2003 | Pai et al. | ..................... 438/424 |
| 6,559,017 | B1 | | 5/2003 | Brown et al. | |
| 6,699,792 | B1 | | 3/2004 | Wang et al. | |
| 2002/0164847 | A1 | * | 11/2002 | Kim et al. | ................... 438/199 |
| 2008/0124880 | A1 | * | 5/2008 | Lin et al. | ..................... 438/305 |

* cited by examiner

*Primary Examiner*—Michelle Estrada
(74) *Attorney, Agent, or Firm*—John A. Fortkor; Fortkort & Houston P.C.

(57) ABSTRACT

A method for making a semiconductor device is provided, comprising (a) providing a semiconductor structure comprising a first gate electrode (210); (b) forming a first set of organic spacers (213) adjacent to said first electrode; (c) depositing a first photo mask (215) over the structure; and (d) simultaneously removing the first set of organic spacers and the first photo mask.

20 Claims, 6 Drawing Sheets

DISPOSABLE ORGANIC SPACERS

FIELD OF THE DISCLOSURE

The present disclosure relates generally to semiconductor devices, and more particularly to methods for making CMOS devices with disposable spacers.

BACKGROUND OF THE DISCLOSURE

As MOSFETs are scaled down to channel lengths below 100 nm, interactions between the source and drain regions of the MOSFET begin to degrade the ability of the gate to switch the transistor on and off. This phenomenon, known in the art as the short channel effect, represents a significant challenge to CMOS scaling.

One approach which has been developed in the art for mitigating the short channel effect utilizes a double implant process to define the source and drain regions of the transistor. In this approach (which is typically implemented after the gate structure is defined on a semiconductor substrate), a dopant is implanted into a thin region just below the top surface of the substrate to form ultra-shallow source/drain extension regions. This implant step also forms a portion of the source/drain regions.

After the extension regions are defined, spacers are formed on the substrate such that they are adjacent to the sides of the gate structure and extend over the source and drain extension regions. Such spacers may be formed by depositing a conformal layer of silicon nitride or silicon oxide, and then subjecting the conformal layer to an anisotropic etch. The substrate is then subjected to a second implant to deepen the source and drain regions. The source and drain extensions are shielded from further doping during this process due to the presence of the spacers. The structure may then be subjected to a thermal anneal to induce dopant diffusion.

DETAILED DESCRIPTION

In one aspect, a method for making a semiconductor device is provided, comprising (a) providing a semiconductor structure comprising a first gate electrode; (b) forming a first set of organic spacers adjacent to said first electrode; (c) depositing a first photo mask over the structure; and simultaneously removing the first set of organic spacers and the first photo mask.

In another aspect, a method for making a semiconductor device is provided, comprising (a) providing a structure comprising first and second gate electrodes disposed on a semiconductor substrate; (b) depositing a first layer comprising a first organic material, the first layer having a first average thickness; (c) etching the first layer with a first etch to define a first set of spacer structures adjacent to the first electrode; (d) depositing a second layer comprising a second organic material, the second layer having a second average thickness which is different from the first average thickness; and (e) etching the second layer with a second etch to define a second set of spacer structures adjacent to the second electrode.

In a further aspect, a method for making a semiconductor device is provided which comprises (a) providing a semiconductor structure having a gate electrode disposed on a semiconductor substrate; (b) forming a set of organic spacers adjacent to the gate electrode; and (c) subjecting the structure to silicidation.

In still another aspect, a method for making a CMOS device is provided which comprises (a) providing a semiconductor structure having first and second gate electrodes disposed in first and second regions thereof, respectively; (b) forming a first set of organic spacers adjacent to each of said first and second electrodes by depositing a first layer comprising a first organic material having a first average thickness, and etching the first layer with a first etch; (c) depositing a first photo mask over the structure such that at least a portion of the first region is exposed, and at least a portion of the second region is covered; (d) subjecting the first region to an implantation process; (e) removing the first set of organic spacers; (f) forming a second set of organic spacers adjacent to each of said first and second electrodes by depositing a second layer comprising a second organic material having a second average thickness, and etching the second layer with a second etch; (g) depositing a second photo mask over the structure such that at least a portion of the second region is exposed and at least a portion of the first region is covered; (h) subjecting the second region to an implantation process; and (i) removing the second set of organic spacers.

Despite the advantages of the foregoing approach, the use of silicon oxide or silicon nitride spacers has some notable drawbacks. In particular, these spacers require the use of selective etch chemistries during their formation and removal, which places significant design constraints on the process flow. In addition, the removal of these spacers often results in silicon gouging, especially if the selectivity of the etch process used to remove the spacers is not sufficiently high.

Moreover, in many applications, it is desirable to remove spacers, and then possibly replace them, during a process of the type described above. Such applications may include, but are not limited to, ultra-shallow junction formation, processes utilizing customizable NMOS or PMOS extension offsets or customizable source/drain main spacer widths or shapes, and contact ESL (Etch Stop Layer) stressor enhancement. In such applications, the use of easily removable spacers would be desirable.

It has now been found that the foregoing needs may be addressed by utilizing organic spacers in conjunction with a photo masking scheme to process a semiconductor device, after which the spacers may be stripped with the same chemistry used to strip the photo resist. Preferably, removal of the spacers occurs simultaneously with removal of the photoresist. This approach may be implemented in a stepwise fashion to independently process different regions of a semiconductor device.

Such a process eliminates the extra processing steps typically required for spacer and photoresist removal, while leveraging the greater ease with which organic spacers may be removed from semiconductor substrates as compared to silicon oxide or silicon nitride spacers. Thus, such a process may avoid or minimize silicon gouging. It has also been found that organic spacers of the type described herein may be advantageously utilized during silicidation, where their ease of removal and less stringent process chemistry requirements minimize damage to the substrate and provide a more versatile process flow.

The methodologies described herein may be advantageously leveraged in the fabrication of CMOS devices. In particular, first and second sets of organic spacers may be utilized for implantation of the source and drain regions in the NMOS and PMOS regions of a CMOS device. Since these spacers are easier to remove than conventional spacers, and since the removal of these spacers causes less damage to the substrate (and may be effected in the same step used to remove the associated photo mask), the first and second sets of spacers may be defined in multiple (separate) processing steps. Consequently, the dimensions of the spacers may be chosen to optimize the NMOS and PMOS regions of the device. Such an approach would be less desirable using conventional spacers (which would also typically require separate removal of the spacers and photo masks), due to the increased likelihood of damage to the semiconductor structure attendant to the additional etches required to define and remove the spacers and associated photo masks.

The devices and methodologies described herein may be better appreciated by first considering the prior art process depicted in FIGS. 1-5, which utilizes amorphous carbon spacers to define the source/drain regions of a semiconductor device.

Figure 1:
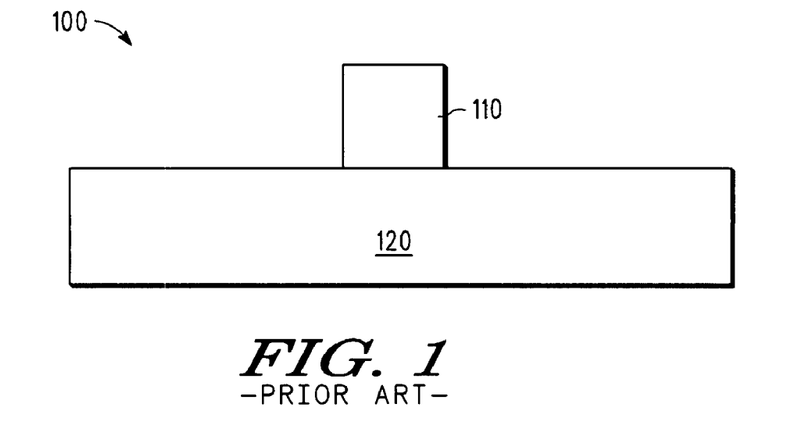
FIG. 1 is an illustration of a step in a prior art process for making organic spacers.
Figure 2:
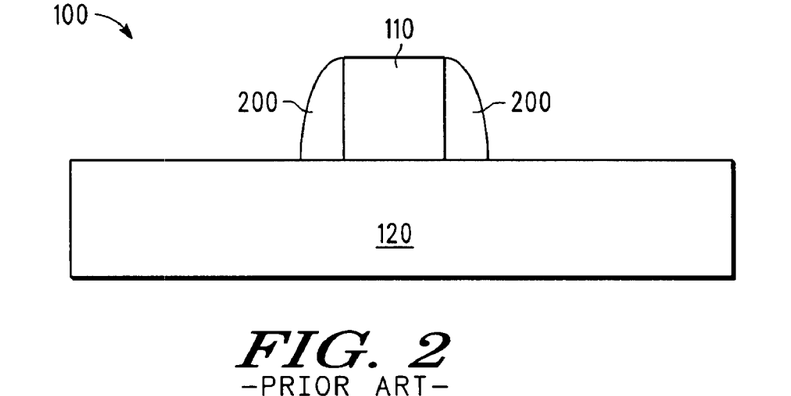
FIG. 2 is an illustration of a step in a prior art process for making organic spacers.

With reference to FIG. 1, a semiconductor structure 100 is provided which comprises a gate electrode 110 disposed upon a substrate 120. As shown in FIG. 2, amorphous carbon spacers 200 are formed on lateral sidewalls of the gate 110. The carbon spacers 200 may be formed by depositing amorphous carbon as a blanket film using a PECVD process. An anisotropic etch back is then used to define the spacers 200.

Figure 3:
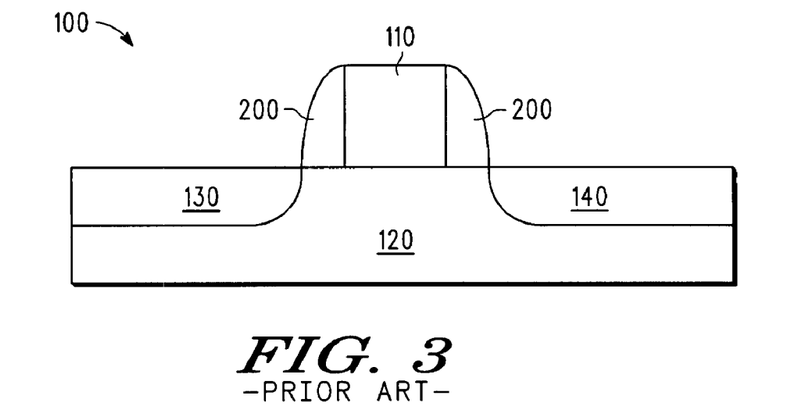
FIG. 3 is an illustration of a step in a prior art process for making organic spacers.

Referring now to FIG. 3, source 130 and drain 140 regions may be formed by implanting a suitable dopant into the substrate 110. The gate 110 may also be implanted during this process. The dopant may then be activated with a rapid thermal anneal (RTA). The RTA may be a high thermal budget process, which may include exposure of the substrate 110 to temperatures on the order of 1000° C. to 1050° C.

Figure 4:
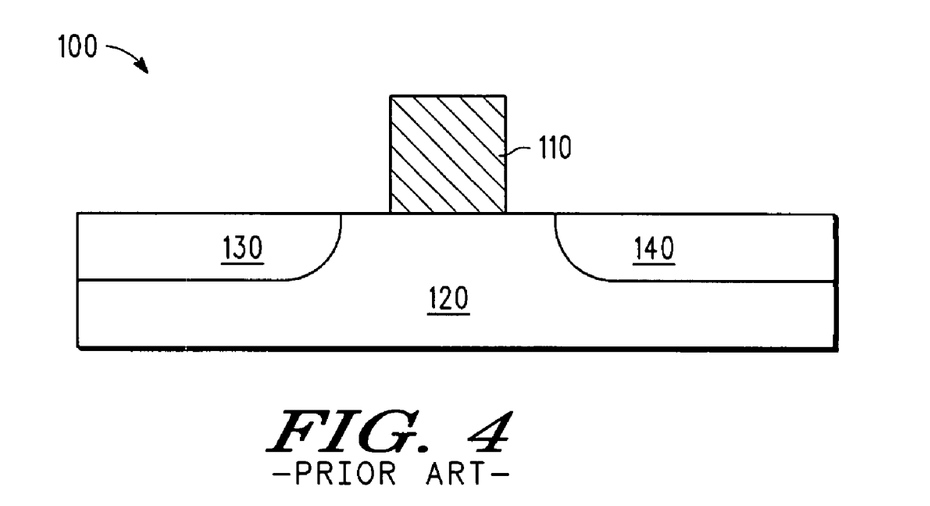
FIG. 4 is an illustration of a step in a prior art process for making organic spacers.

As shown in FIG. 4, the amorphous carbon spacers 200 may then be removed by oxygen ashing using an $O_2$ plasma. Alternatively, an oxidizing wet chemistry, such as a sulfuric acid/hydrogen peroxide mixture, or a dry etch chemistry, such as HBr and $Cl_2$, may be used for this purpose.

Figure 5:
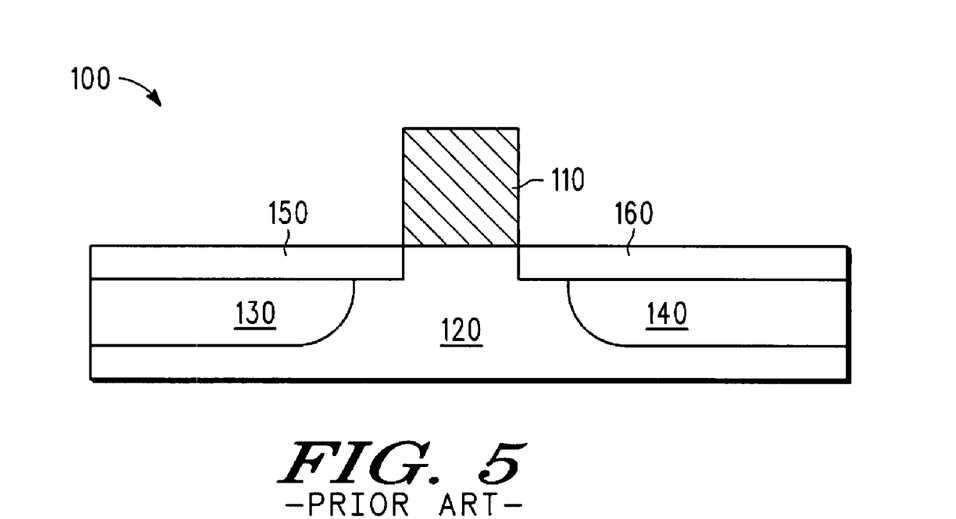
FIG. 5 is an illustration of a step in a prior art process for making organic spacers.

As shown in FIG. 5, halo and extension implants are then provided to form extension regions 150 and 160. The halo and extension implant regions may be defined using offset spacers, which may be created by depositing a thin oxide film and subjecting the film to an etch back. The offset spacers provide a margin for subsequent thermal processing, so that the extension implant does not over-run the channel region.

Figure 6:
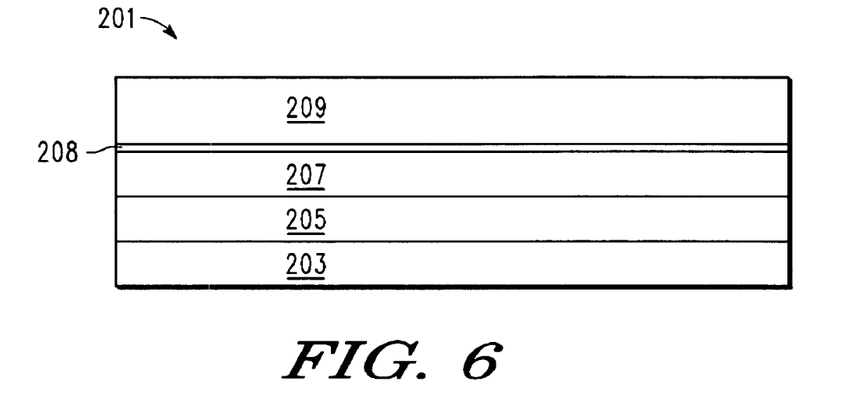
FIG. 6 is an illustration of a step in a first particular, non-limiting embodiment of a process in accordance with the teachings herein.

FIGS. 6-17 illustrate a first particular, non-limiting embodiment of a method for utilizing an organic spacer in accordance with the teachings herein. With reference to FIG. 6, a semiconductor structure 201 is provided which comprises a semiconductor substrate 203 having a dielectric layer 205 and a semiconductor layer 207 disposed thereon. Such a structure may be, for example, a semiconductor-on-insulator (SOI) wafer which may be formed from a handle wafer and a donor wafer. A gate dielectric layer 208 is formed on the surface of semiconductor layer 207 through thermal oxidation or by other suitable means, and a layer of polysilicon 209 is formed on the gate dielectric layer 208.

Figure 7:
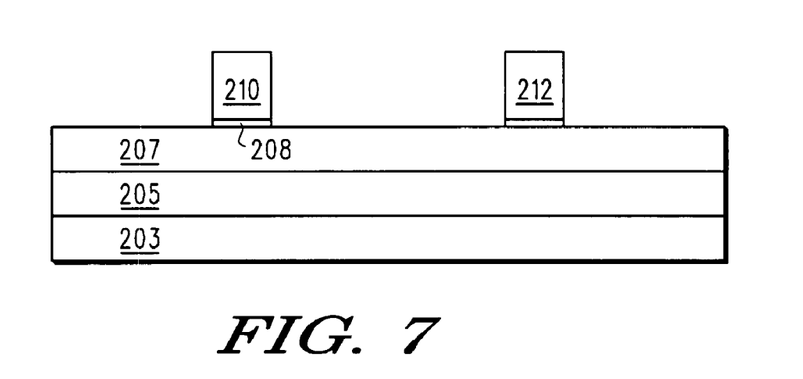
FIG. 7 is an illustration of a step in a first particular, non-limiting embodiment of a process in accordance with the teachings herein.

Referring to FIG. 7, the polysilicon layer 209 is then patterned to define gate electrodes 210, 212. The underlying gate dielectric layer 208 is also patterned during this process. This may be accomplished by suitable masking and etching processes which are well known in the art.

Figure 8:
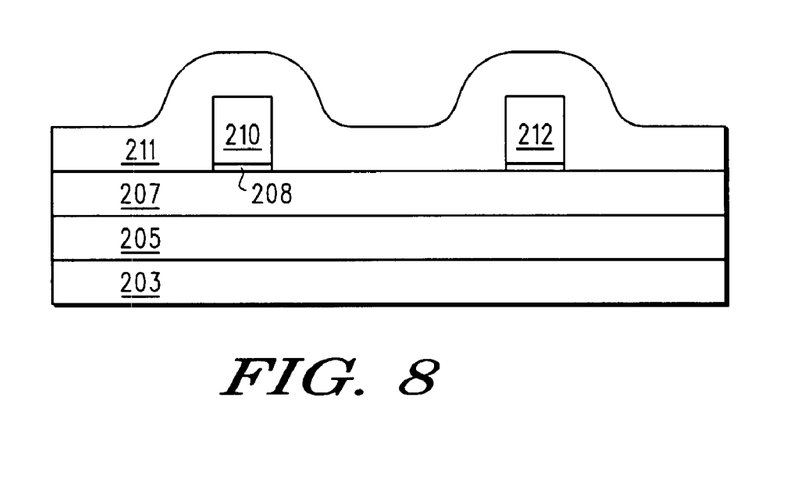
FIG. 8 is an illustration of a step in a first particular, non-limiting embodiment of a process in accordance with the teachings herein.

With reference to FIG. 8, a first conformal layer of organic spacer material 211 is then deposited over the structure. The layer of organic spacer material 211 may comprise various materials, such as parylene, polyamide, or polysulfone, and may also comprise plasma deposited polymers such as, for example, plasma fluorocarbon polymers.

The layer of organic spacer material 211 may also comprise amorphous carbon. Such a material may be formed, for example, by chemical vapor deposition (CVD) (or more specifically plasma enhanced CVD (PECVD)) using a process gas which preferably comprises propylene ($C_3H_6$), and which may also comprise one or more hydrocarbons such as, for example, methane ($CH_4$), acetylene ($C_2H_2$), ethylene ($C_2H_4$), ethane ($C_2H_6$), or propane ($C_3H_8$). The flow rate of the propylene in the process chamber may be set, for example, to between about 500 standard cubic centimeters per minute (sccm) and about 3000 sccm. An additional gas, such as helium, may be also introduced into the chamber at a suitable flow rate. The flow rate of helium into the process chamber may be set, for example, between about 250 sccm and about 1000 sccm. During the process of forming the amorphous carbon layer, the deposition chamber is typically subjected to a suitable radio frequency (RF) power and is maintained at an appropriate pressure. In some embodiments, the radio frequency power is set between about 450 Watts and about 1000 Watts, and the pressure is set between about 4 Torr and about 6.5 Torr.

The layer of organic spacer material 211 may be deposited to various thicknesses, and the preferred thickness may depend, in part, on the particular application. Preferably, however, the layer of organic spacer material 211 is deposited to a thickness within the range of about 200 Å to about 1000 Å, more preferably to a thickness within the range of about 400 Å to about 800 Å, even more preferably to a thickness within the range of about 500 Å to about 700 Å, and most preferably to a thickness of about 600 Å. Optionally, a conventional dielectric (such as $SiO_2$) may be used as a liner underneath the spacer to act as an etch stop or to provide protection to the gate stack during subsequent processing.

Figure 9:
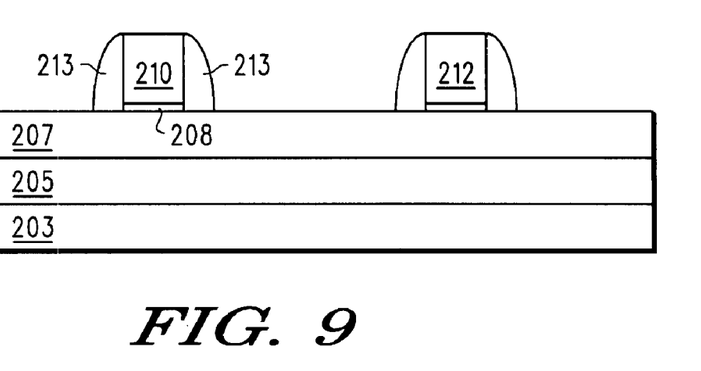
FIG. 9 is an illustration of a step in a first particular, non-limiting embodiment of a process in accordance with the teachings herein.

Referring now to FIG. 9, the layer of organic spacer material 211 is then etched back to form spacers 213 adjacent to each of gate electrodes 210, 212. Various etches may be utilized for this purpose. These include, for example, plasma etches based on gaseous mixtures of halogen-containing and halocarbon-containing materials, which may provide high etch selectivity for the organic spacer material 211 over semiconductor layers (such as Si, SiGe, SiC, and SiGeC), dielectric layers (such as $SiO_2$), metal silicides (such as $CoSi_2$, NiSi, NiPtSi, and PtSi), and metal gate materials (such as Ti, TiN, W, TaN, Mo, TaC) and the like. Suitable halogen-containing gases which may be utilized in such an etch include those containing F, Br, and Cl. Specific examples of such gases include $CF_4$, $CHF_3$, $CH_2F_2$, HCl, $Cl_2$, $BCl_3$, HBr, $Br_2$, and the like. Suitable oxygen-containing gases which may be utilized in such an etch include, for example, carbon dioxide ($CO_2$), oxygen ($O_2$), carbon monoxide (CO), sulfur dioxide ($SO_2$), and the like. The gas mixture may also comprise one or more inert gases such as nitrogen ($N_2$), helium (He), argon, (Ar), neon (Ne), and the like.

As a specific example of the foregoing, if the organic spacer material 211 is amorphous carbon, it may be etched in a plasma reactor equipped with decoupled source and bias powers to produce a high-density plasma. The reactor may be provided with hydrogen bromide (HBr) at a flow rate of about 50 sccm to about 200 sccm, and nitrogen ($N_2$) at a flow rate of about 20 sccm to about 80 sccm. Power is then applied to the inductively coupled antenna of the reactor at between 500 to 1200 W with a cathode bias power of between 50 to 200 W, and the wafer temperature may be maintained within the range of about 10 to about 60° C. at a pressure in the process chamber of between 1 to 30 mTorr. The nitrogen ($N_2$) may optionally be supplemented or replaced with oxygen ($O_2$), argon (Ar), carbon monoxide (CO), or the like such that the gas chemistry may comprise, for example, $HBr/N_2/O_2/Ar$, $HBr/O_2/Ar$, or $HBr/N_2/CO/Ar$.

The advantage of using amorphous carbon as the spacer material is that these various chemistries used to etch it are capable of producing very minimal damage, or gouging, to the underlying substrate. Additionally, the ratio of process gases may be adjusted so as to modulate the shape and width of the organic spacer. This is possible because the properties of the amorphous carbon compared to traditional $SiO_2$ or $Si_3N_4$ spacer material allow for more adjustment of isotropic versus anisotropic etch rates.

Figure 10:
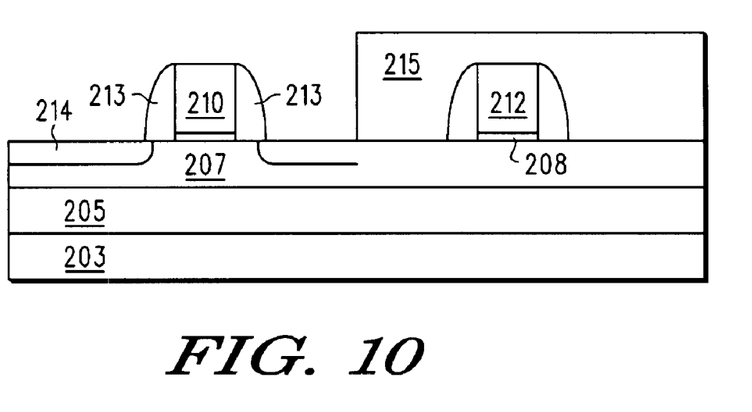
FIG. 10 is an illustration of a step in a first particular, non-limiting embodiment of a process in accordance with the teachings herein.

As shown in FIG. 10, a layer of photoresist 215 is then deposited and patterned such that a first region of the device containing gate electrode 210 is exposed, and a second region of the device containing gate electrode 212 is covered. The first and second regions may correspond, for example, to the respective PMOS and NMOS regions of a CMOS device.

Figure 11:
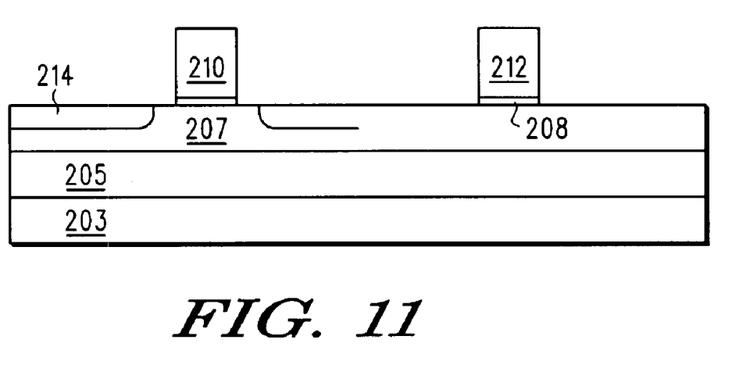
FIG. 11 is an illustration of a step in a first particular, non-limiting embodiment of a process in accordance with the teachings herein.

The exposed region is then subjected to implantation to define source/drain regions 214 adjacent to the gate electrode 210. The layer of photoresist 215 is then stripped, and the organic spacers 213 are removed by oxygen ashing as shown in FIG. 11. Preferably, oxygen ashing or another suitable technique is used both to strip the layer of photoresist 215 and to remove the spacers 213 in a single processing step. This eliminates the extra processing step required for separate spacer and photoresist removal, and minimizes silicon gauging.

A wide variety of spacer materials and photoresists (both positive and negative) may be utilized which permit the simultaneous removal of the photoresist (and more specifically, the cured or uncured portion thereof used to mask the substrate) and the spacers 213. For example, if the spacers 213 comprise amorphous carbon and the photoresist 215 comprises a polyhydroxystyrene-based polymer or a mixture of diazonaphthoquinone (DNQ) and a phenol formaldehyde resin, then oxygen ashing may be utilized to simultaneously remove both the spacers 213 and the photoresist 215.

Figure 12:
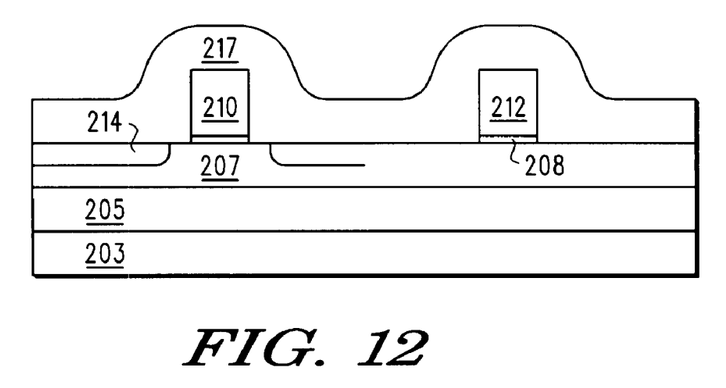
FIG. 12 is an illustration of a step in a first particular, non-limiting embodiment of a process in accordance with the teachings herein.

Referring now to FIG. 12, a second conformal layer of organic spacer material 217 is deposited over the structure. The materials used in the layer of organic spacer material 217 may comprise any of the materials which may be used in organic spacer material 211, and the two layers may have the same or different compositions.

The second layer of organic spacer material 217 may be deposited to various thicknesses, and the preferred thickness may depend, in part, on the particular application. Preferably, however, the second layer of organic spacer material 217 is deposited to a thickness within the range of about 600 Å to about 1400 Å, more preferably to a thickness within the range of about 800 Å to about 1200 Å, even more preferably to a thickness within the range of about 900 Å to about 1100 Å, and most preferably to a thickness of about 1000 Å.

Figure 13:
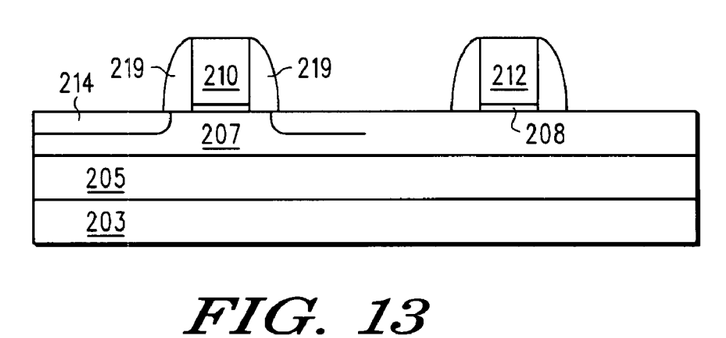
FIG. 13 is an illustration of a step in a first particular, non-limiting embodiment of a process in accordance with the teachings herein.
Figure 14:
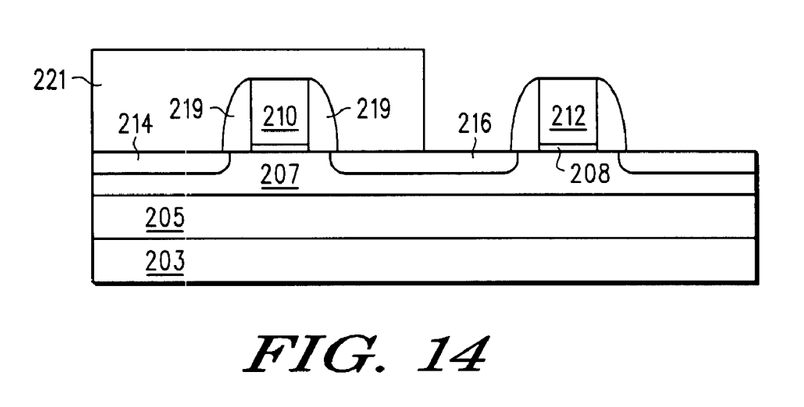
FIG. 14 is an illustration of a step in a first particular, non-limiting embodiment of a process in accordance with the teachings herein.
Figure 15:
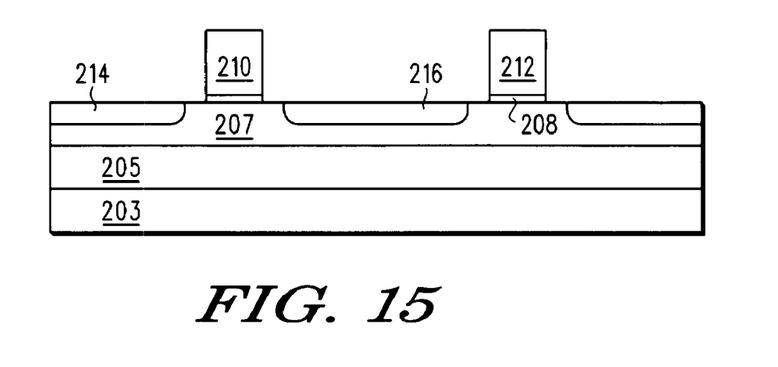
FIG. 15 is an illustration of a step in a first particular, non-limiting embodiment of a process in accordance with the teachings herein.

The second layer of organic spacer material 217 is then etched back as described above to produce spacers 219 adjacent to the gate electrodes 210, 212 as shown in FIG. 13. A layer of photoresist 221 is then deposited over the structure and is patterned such that gate electrode 210 is covered and gate electrode 212 is exposed, as shown in FIG. 14. The exposed region is then subjected to implantation to define source/drain regions 216 adjacent to the gate electrode 212. The spacers 219 and layer of photoresist 221 are then removed as described above (and preferably in the same process step) to yield the structure shown in FIG. 15.

Figure 16:
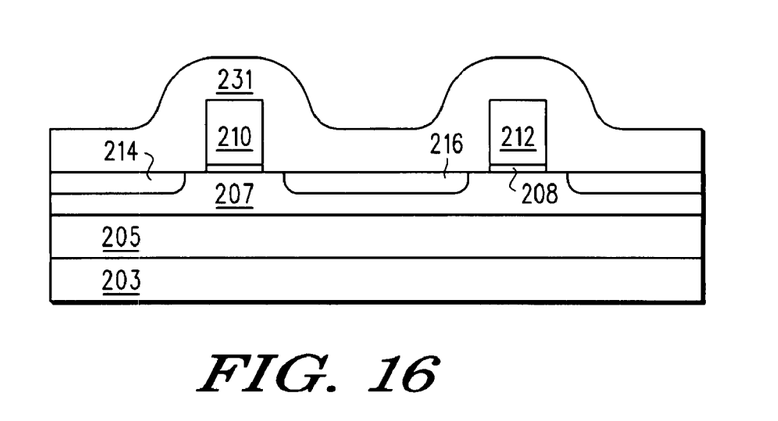
FIG. 16 is an illustration of a step in a first particular, non-limiting embodiment of a process in accordance with the teachings herein.

As shown in FIG. 16, a third layer of organic spacer material 231 having any of the compositions described above is again deposited over the structure for the formation of silicide spacers. Again, the third layer of organic spacer material 231 may be deposited to various thicknesses, and the preferred thickness may depend, in part, on the particular application. Preferably, however, the third layer of organic spacer material 231 is deposited to a thickness within the range of about 200 Å to about 1000 Å, more preferably to a thickness within the range of about 400 Å to about 800 Å, even more preferably to a thickness within the range of about 500 Å to about 700 Å, and most preferably to a thickness of about 600 Å. The third layer of organic spacer material 231 is then etched back to form spacers 233 adjacent to the gate electrodes 210, 212 using any of the etches previously described for this purpose.

Figure 17:
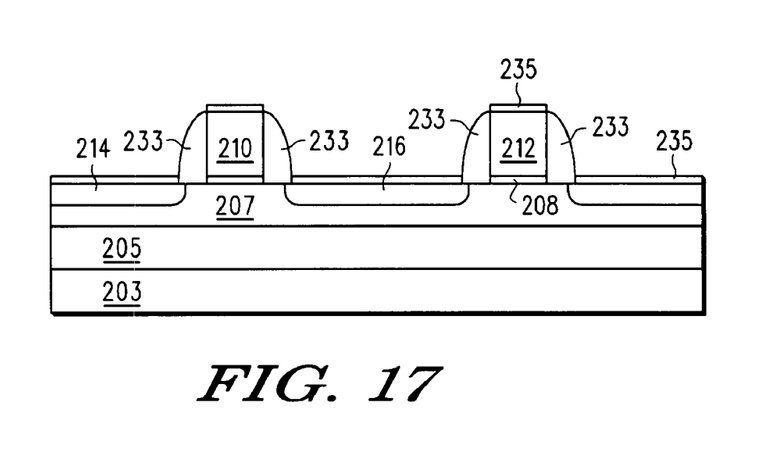
FIG. 17 is an illustration of a step in a first particular, non-limiting embodiment of a process in accordance with the teachings herein.

Referring now to FIG. 17, the structure is subjected to silicidation to form a metal silicide layer 235 thereon. Various metal silicides as are known to the art may be used for this purpose, although the use of nickel silicide or nickel platinum silicide is preferred. The spacers 233 are then stripped as described above or with the excess metal removal wet etch, and the contact ESL stressor is then formed. Alternately, the organic spacers can be removed using a reducing chemistry so as to not oxidize or otherwise damage the metal silicide. The spacer removal may be a plasma etch based on a gaseous mixture of hydrogen-containing materials such as $H_2$, $H_{21}N_2$, $NH_3$, and the like.

The process depicted in FIGS. 6-17 has several advantages over existing CMOS processes. Thus, in a conventional CMOS process, spacers are formed from standard dielectric films such as silicon oxide, silicon nitride, or silicon oxynitride. In order to remove these materials without damaging other parts of the device, a wet or dry etch with sufficient selectivity is required, which puts significant constraints on the process chemistry. Moreover, these films are typically deposited using high temperature processes which can result in unwanted diffusion in implant areas within the device, and the removal of these films frequently results in gouging.

By contrast, disposable spacers of the type described herein may be formed through low temperature deposition processes which avoid dopant diffusion. Typically, these materials may be deposited at temperatures of less than about 400° C. The organic spacers described herein assume standard sidewall spacer shapes, and may be readily removed, for example, through a comparatively gentle oxygen ashing process which avoids silicon gouging and which does not harm other parts of the device. Because of these properties, the sequence of organic spacer deposition, etch and strip can be done as many times as needed to fully customize the process flow. Moreover, the organic spacers described herein may be utilized with photoresist masking to selectively process a substrate in multiple process cycles, and both the organic spacers and the (developed) photoresist may be removed with the same chemistry.

The organic spacers described herein may be utilized in various additional embodiments in accordance with the teachings herein. For example, rather than utilizing organic spacers in each implant and silicidation step as described in FIGS. 6-17, conventional spacers (including, for example, spacers formed from silicon oxides, silicon nitrides, or silicon oxynitrides) may be utilized in one or more of these steps, with organic spacers being utilized in at least one step. Thus, for example, conventional spacers may be utilized to define the source and drain regions of a device (whether made by a process such as that described in FIGS. 6-17 or otherwise), and organic spacers may be utilized in the silicidation step. The benefits of such an approach may include reduced parasitic capacitance, and enhanced ESL stressor behavior due to a closer proximity of the stressor material to the channel of the device. Alternatively, conventional spacers may be utilized during silicidation, and organic spacers of the type described herein may be utilized to define one or more source or drain regions.

In other embodiments, a conventional process flow may be utilized up through gate formation. Thereafter, a first set of organic spacers may be formed followed by implantation of a P+ extension region, after which the first set of organic spacers may be stripped. A second set of organic spacers with the same or different thickness may be formed followed by implantation of an N+ extension region, after which the second set of organic spacers may be stripped. Conventional spacers may then be utilized to finish the source/drain implants. Of course, it will be appreciated that, in such embodiments, the N+ extension region may be formed before the P+ extension region, or vice versa.

In still other embodiments, a conventional process flow may be utilized through gate formation. First and second sets of spacers (which may be of first and second thicknesses, wherein the first and second thicknesses may be the same or different) may then be utilized during N+ and P+ source/drain implants, respectively. A high temperature source/drain anneal (which may, for example, be a spike anneal) may be utilized to induce dopant diffusion. Conventional spacers may then be utilized to finish the extension implants, followed by a lower Dt anneal. The low Dt anneal may be a laser anneal, a flash anneal, or the like, or may be used for solid phase epitaxial regrowth (SPER).

In still further embodiments, differential spacers may be achieved by using organic spacers of the type described herein in conjunction with an oxide hard mask. The oxide hard mask may comprise, for example, tetraethylorthosilicate (TEOS) or undoped oxide (UDOX). In such embodiments, a first set of organic spacers may be removed with a photoresist strip, while a second set of spacers is protected by the oxide hard mask and remains. The first and second sets of spacers may be disposed, for example, in the NMOS and PMOS regions of a CMOS device.

The above description of the present invention is illustrative, and is not intended to be limiting. It will thus be appreciated that various additions, substitutions and modifications may be made to the above described embodiments without departing from the scope of the present invention. Accordingly, the scope of the present invention should be construed in reference to the appended claims.

What is claimed is:

1. A method for making a semiconductor device, comprising:
providing a semiconductor structure comprising a first gate electrode disposed in a first region and a second gate electrode disposed in a second region;
forming a first set of organic spacers adjacent to said first electrode through a process which includes (a) depositing a first layer comprising a first organic material having a first average thickness, and (b) etching the first layer with a first etch;
depositing a first photo mask over the structure such that at least a portion of the first region is exposed and at least a portion of the second region is covered;
subjecting the first region to a first implantation process;
concurrently removing the first set of organic spacers and the first photo mask;
forming a second set of organic spacers adjacent to said second electrode through a process which includes (a) depositing a second layer comprising a second organic material having a second average thickness, and (b) etching the second layer with a second etch;
depositing a second photo mask over the structure such that at least a portion of the second region is exposed and at least a portion of the first region is covered;
subjecting the second region to a second implantation process; and
concurrently removing the second set of organic spacers and the second photo mask.

2. The method of claim 1, wherein the first set of organic spacers is removed with a solution which also removes the first photo mask.

3. The method of claim 1, wherein the first set of organic spacers and the first photo mask are removed with the same etch chemistry.

4. The method of claim 1, wherein the first set of spacers is removed with a process comprising oxygen ashing using an $O_2$ plasma.

5. The method of claim 1, wherein the first set of organic spacers is removed with a plasma etch based on a gaseous mixture of a halogen-containing material and an oxygen-containing material.

6. The method of claim 5, wherein the oxygen-containing material is selected from the group consisting of carbon diox ide, oxygen, carbon monoxide, water, and sulfur dioxide, and wherein the gaseous mixture also comprises at least one gas selected from the group consisting of nitrogen ($N_2$), helium (He), argon, (Ar), and neon (Ne).

7. The method of claim 1, wherein the semiconductor structure is subject to an implantation process after the first set of spacers is formed and before the first set of spacers is removed.

8. The method of claim 1, wherein the first region is a PMOS region and wherein the second region is an NMOS region.

9. The method of claim 1, wherein the first and second average thicknesses differ by at least 200 Å.

10. The method of claim 1, further comprising:
forming a third set of organic spacers adjacent to each of said first and second electrodes by depositing a third layer of a third organic material having a third average thickness over the structure, and etching the third layer to define the third set of spacer structures; and
forming a layer of metal silicide over the structure.

11. The method of claim 1, wherein the first organic material is PECVD deposited amorphous carbon.

12. The method of claim 1, wherein the first and second organic materials are selected from the group consisting of plasma deposited organic polymers.

13. The method of claim 1, further comprising:
forming a third set of organic spacers adjacent to each of the first and second gate electrodes; and
subjecting the structure to silicidation.

14. The method of claim 13, further comprising:
removing the third set of organic spacers.

15. The method of claim 14, wherein the organic spacers are removed using a plasma etch with a reducing chemistry selected from the group consisting of $H_2$, $H_2/N_2$, and $NH_3$.

16. The method of claim 1, wherein the first average thickness is different from the second average thickness.

17. The method of claim 16, wherein the first and second average thicknesses differ by at least 200 Å.

18. The method of claim 1, wherein the first and second layers are deposited at a temperature of less than about 400° C.

19. The method of claim 13, wherein subjecting the structure to silicidation includes forming a layer of nickel silicide or nickel platinum silicide on the structure.

20. The method of claim 1, wherein the first and second layer comprise amorphous carbon, and wherein at least one of the first and second photo masks comprises a material selected from the group consisting of (a) polyhydroxystyrene-based polymers and (b) mixtures of diazonaphthoquinone (DNQ) and phenol formaldehyde resins.

* * * * *